United States Patent
Maruyama et al.

(10) Patent No.: US 10,175,813 B2
(45) Date of Patent: Jan. 8, 2019

(54) TOUCH PANEL BOARD WITH GUARD PORTION AND FLEXIBLE WIRING BOARD CONNECTING GUARD PORTION TO GROUND WIRE

(71) Applicant: Sharp Kabushiki Kaisha, Sakai, Osaka (JP)

(72) Inventors: Takenori Maruyama, Sakai (JP); Kazutoshi Kida, Sakai (JP); Shogo Hayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 132 days.

(21) Appl. No.: 15/318,406

(22) PCT Filed: Jun. 26, 2015

(86) PCT No.: PCT/JP2015/068463
§ 371 (c)(1),
(2) Date: Dec. 13, 2016

(87) PCT Pub. No.: WO2016/002645
PCT Pub. Date: Jan. 7, 2016

(65) Prior Publication Data
US 2017/0123570 A1    May 4, 2017

(30) Foreign Application Priority Data

Jul. 3, 2014 (JP) ................. 2014-137656

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/041* (2013.01); *G06F 3/044* (2013.01);
(Continued)

(58) Field of Classification Search
CPC .................. G06F 3/0416; G06F 3/044; G06F 2203/04103; G06F 2203/04107;
(Continued)

(56) References Cited

U.S. PATENT DOCUMENTS 8,587,533 B2 * 11/2013 Nishihara ............. G06F 3/0416
345/173
2006/0267863 A1 * 11/2006 Kim .................... G02F 1/13452
345/51
(Continued)

FOREIGN PATENT DOCUMENTS

JP    2010-218542 A    9/2010

*Primary Examiner* — Darlene M Ritchie
(74) *Attorney, Agent, or Firm* — Keating & Bennett, LLP

(57) ABSTRACT

A touch panel board includes an electrode board, a cover panel, a flexible wiring board, a guard portion, and a ground connection wire. The electrode board includes a support board, sensor electrodes supported on the support board, and connection terminals electrically connected to the sensor electrodes and supported on the support board and collectively arranged on an outer side with respect to the sensor electrodes. The flexible wiring board includes conductive wires, one end thereof being connected to the connection terminals, respectively, and a ground wire. The conductive guard portion is arranged on a side of the opposing surface of the projected end portion to be arranged on an outer side with respect to the connection terminals. The ground connection wire electrically connects the guard portion and the ground wire.

7 Claims, 27 Drawing Sheets

(51) Int. Cl.
*G02F 1/1362* (2006.01)
*H05K 1/02* (2006.01)
*H05K 3/36* (2006.01)
*H05K 1/14* (2006.01)
*G06F 1/18* (2006.01)

(52) U.S. Cl.
CPC .. *G02F 2001/136218* (2013.01); *G06F 1/183* (2013.01); *G06F 2203/04107* (2013.01); *H05K 1/0218* (2013.01); *H05K 1/147* (2013.01); *H05K 3/361* (2013.01)

(58) Field of Classification Search
CPC .......... G06F 2203/04102; H01L 23/60; H01L 27/3276; H05K 1/028; H05K 1/0218; H05K 1/0393; H05K 1/189; H05K 1/147; H05K 1/0259; H05K 1/0224; H05K 1/142; H05K 9/0088; H05K 9/0084; H05K 9/0039; H05K 9/0081; H05K 2201/10371; H05K 2201/05; H05K 2201/09218; H05K 2201/09681; H05K 3/361; H05K 3/4644; H01R 12/775; H01R 12/61; H01R 12/77; H01R 13/6581; G02F 1/136204; G02F 2001/133334; G02F 2202/22

See application file for complete search history.

(56) References Cited

U.S. PATENT DOCUMENTS

| | | | |
|---|---|---|---|
| 2010/0220071 A1 | 9/2010 | Nishihara et al. | |
| 2011/0134075 A1* | 6/2011 | Takusa | G06F 3/044 345/174 |
| 2011/0304571 A1* | 12/2011 | Kim | G02F 1/13338 345/173 |
| 2011/0316803 A1* | 12/2011 | Kim | G06F 3/044 345/173 |
| 2012/0075214 A1* | 3/2012 | Kim | G06F 3/041 345/173 |
| 2012/0249458 A1* | 10/2012 | Okazaki | G06F 3/044 345/173 |
| 2013/0271425 A1* | 10/2013 | Kurashima | G06F 3/044 345/174 |
| 2013/0321304 A1* | 12/2013 | Wang | H01H 9/12 345/173 |
| 2014/0177176 A1* | 6/2014 | Torii | H05K 1/0259 361/748 |
| 2015/0077649 A1* | 3/2015 | Lee | G06F 3/044 349/12 |
| 2015/0077652 A1* | 3/2015 | Lee | G06F 3/044 349/12 |
| 2015/0109543 A1* | 4/2015 | Lee | G06F 3/041 349/12 |

* cited by examiner

TOUCH PANEL BOARD WITH GUARD PORTION AND FLEXIBLE WIRING BOARD CONNECTING GUARD PORTION TO GROUND WIRE

TECHNICAL FIELD

The present invention relates to a touch panel board.

BACKGROUND ART

In recent years, a touch panel board has been installed in electronic devices such as portable phones or laptop computers. The touch panel board can detect a position of an object to be detected when the object to be detected such as a finger is contacted with or close to a detection surface (a touch surface).

For example, an electrostatic capacity type touch panel board includes an electrode layer (an electrode board) and a touch controller. The electrode layer includes first sensor electrodes extending in a first direction and a second electrode extending in a second direction that is perpendicular to the first direction. The touch controller computes a position of an object to be detected based on change in the electrostatic capacity generated between the first sensor electrodes and the second sensor electrode. In such a touch panel board, it is known that the static electricity may cause errors in operation of the touch controller or electrostatic breakdown if static electricity is applied to the sensor electrodes from outside.

Patent Document 1 describes a touch panel that blocks static electricity or electromagnetic noise applied from outside such that erroneous recognition due to erroneous operation is less likely to occur. The touch panel described in Patent Document 1 includes a rectangular base board, and detection electrodes (sensor electrodes) and wiring electrodes formed on a surface of the base board. The wiring electrodes are electrically connected to the detection electrodes and transfer detection signals to a detection circuit. The detection electrodes are arranged in a middle portion of the base board and form a detection area. The wiring electrodes are arranged in an outside area of the detection area and form a wiring area. The wiring electrodes have end portions that are collectively arranged in an edge portion of the base board and form a terminal portion. A block electrode is arranged in an outer peripheral portion of a surface of the base board to surround the detection area and the wiring area. The block electrode blocks noise from outside. The block electrode is connected to ground and blocks noise. Even if noise enters the base board via the edge portion, the noise is blocked prior to reaching the wiring electrode or the detection electrodes.

RELATED ART DOCUMENT

Patent Document

Patent Document 1: Japanese Unexamined Patent Application Publication No. 2010-218542

Problem to be Solved by the Invention

However, the block electrode does not completely surround the detection area and the wiring area on the base board and the block electrode is not formed in a part of the outer peripheral portion of the base board where the terminal portion is formed. Namely, the block electrode has a substantially frame shape, as a whole, to surround the detection area and the wiring area. However, the block electrode is disconnected in the part where the terminal portion is formed. Therefore, in the touch panel of the related art, noise or static electricity may enter via the portion having no block electrode (near the terminal portion).

In Patent Document 1, the terminal portion of the base board is connected to one edge of the flexible wiring base board, and another block electrode is mounted on the flexible wiring base board to be fit in a disconnection portion of the block electrode. However, the other block electrode is not formed on the base board like the frame-shaped block electrode but is formed on the flexible wiring base board. Therefore, the other block electrode does not effectively block noise or static electricity entering along a surface of the base board.

DISCLOSURE OF THE PRESENT INVENTION

The technology disclosed herein was made in view of the above circumstances. An object is to provide a touch panel board that is capable of blocking static electricity flowing into connection terminals of sensor electrodes that are collectively arranged in an edge portion of a base board that supports the sensor electrodes.

Means for Solving the Problem

A touch panel board according to the present technology includes an electrode board, a cover panel, a flexible wiring board, a guard portion, and a ground connection wire. The electrode board includes a support board, sensor electrodes supported on the support board, and connection terminals electrically connected to the sensor electrodes and supported on the support board and collectively arranged on an outer side with respect to the sensor electrodes. The cover panel includes a projected end portion projected outward further than the support board and arranged on an outer side with respect to the connection terminals, and an opposing surface opposite the electrode board, and the cover panel has a plate shape with the opposing surface facing the electrode board. The flexible wiring board includes conductive wires, one end thereof being connected to the connection terminals, respectively, and a ground wire, and the flexible wiring board extends from the support board toward the projected end portion. The conductive guard portion is arranged on a side of the opposing surface of the projected end portion to be arranged on an outer side with respect to the connection terminals. The ground connection wire electrically connects the guard portion and the ground wire. According to the touch panel board having the above configuration, the guard portion blocks static electricity entering the connection terminals of the sensor electrodes collectively arranged on an edge portion of the base board supporting the sensor electrodes.

In the above touch panel board, the flexible wiring board may include an insulation layer covering the conductive wires and the ground wire, and the ground connection wire may include a contact portion and a connection portion. The contact portion may be formed on a surface of the insulation layer and in contact with the guard portion and the connection portion may be formed on the surface of the insulation layer or within the insulation layer and connecting the contact portion and the ground wire. The guard portion may be closely in contact with a portion of the insulation layer having the contact portion to fix the flexible wiring board. With the touch panel board having such a configuration, the ground connection wire can be formed integrally with the flexible wiring board. Thus, the ground connection wire is easily handled and easily mounted on a desired part. With the touch panel board having such a configuration, not only one edge portion of the flexible wiring board but also a portion thereof having the contact portion of the ground connection wire is fixed. Therefore, reaction force is less likely to be transferred to the one edge portion of the flexible wiring board. As a result, the flexible wiring board is less likely to be peeled off at the one edge portion and electric disconnection is less likely to occur on the flexible wiring board.

In the above touch panel board, the contact portion may include pads, and the guard portion may be made of an anisotropic conductive film, and the flexible wiring board may be fixed with pressure to the projected end portion via the anisotropic conductive film. With such a configuration, the flexible wiring board is easily fixed to the projected end portion of the cover panel. The guard portion made of anisotropic conductive film captures static electricity and effectively transfers the captured static electricity to the contact portion of the ground connection portion.

In the above touch panel board, the guard portion may be made of a conductive adhesive layer.

In the above touch panel board, the connection terminals may be arranged in a column, and the guard portion may extend in a direction that the connection terminals are arranged.

The above touch panel board may further include a detection circuit that is electrically connected to the sensor electrodes via the flexible wiring board. With the touch panel board including the detection circuit, static electricity directed from outside toward the connection terminals of the electrode board is blocked by the guard portion, and the detection circuit is less likely to be damaged due to static electricity.

In the above touch panel board, the support board may include a conductive block pattern arranged outside the sensor electrodes, and the ground wire may have one end that is connected to the block pattern. The ground wire used as such a block pattern may be connected to the guard portion via the ground connection wire. Further, the touch panel board may include the block pattern and the guard portion and static electricity flowing from outside into the connection terminals of the electrode board is surely blocked.

In the above touch panel board, the electrode board may have a main body portion and a test area portion, and the sensor electrodes and the connection terminals may be formed in the main body portion and the test area portion may be adjacent to the main body portion and separable from the main body portion, and the test area portion may have a test pattern that is connected to the connection terminals. The electrode board including such a test area portion is less likely to have a space in an outside area with respect to the main body portion. Even with such a configuration, static electricity entering the connection terminals in the main body portion of the electrode board from outside can be blocked by the guard portion arranged on the projected end portion of the cover panel that is layered on the electrode board.

Advantageous Effect of the Invention

According to the present technology, a touch panel board that is capable of blocking static electricity flowing into connection terminals of sensor electrodes that are collectively arranged in an edge portion of a base board that supports the sensor electrodes is provided.

MODE FOR CARRYING OUT THE INVENTION

First Embodiment

Figure 1:
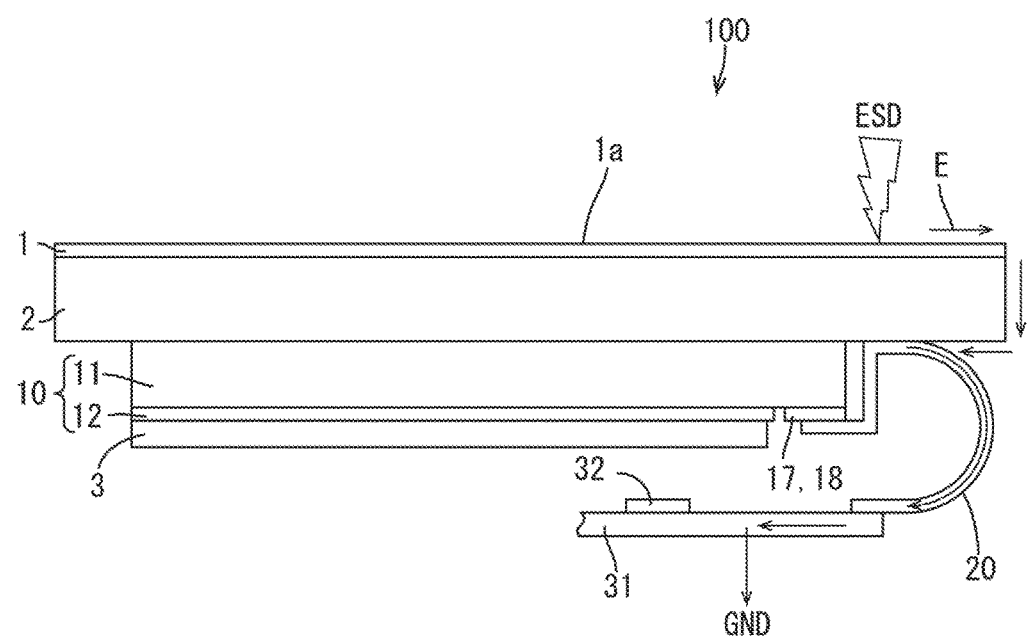
FIG. 1 is a schematic a cross-sectional view illustrating a touch panel board according to a first embodiment.

A first embodiment of the present technology will be described with reference to FIGS. 1 to 6. FIG. 1 is a schematic cross-sectional view of a touch panel board 100 of a first embodiment. As illustrated in FIG. 1, the touch panel board 100 includes an anti-reflection (AR) film 1 for preventing reflection of external light, a cover glass (a cover panel) 2, an electrode board 10 including sensor electrodes, and a protection board 3 that are layered in this order.

In the touch panel board 100, the AR film 1 has a surface 1a that is a touch surface (a detection surface) that detects contact or approach of an object to be detected. The touch panel board 100 does not necessarily include the AR film 1 but may include it as necessary. In a touch panel board without having the AR film 1, a surface of the cover glass 2 is a touch surface. Hereinafter, in the touch panel board 100 and each configuration, a touch surface-side corresponds to a front surface side and a surface side opposite from the touch surface corresponds to a rear surface side.

The cover glass 2 and the electrode board 10 on a rear-surface side with respect to the cover glass 2 are adhered to each other via optical clear adhesive (OCA, an transparent optical adhesive film). Namely, the electrode board 10 is layered on an opposing surface 2b of the cover glass 2 via the OCA. The opposing surface 2b is opposite the electrode board 10. A black matrix (BM), which is not illustrated, is disposed on an outer peripheral portion of the rear surface (the opposing surface 2b) of the cover glass 2. The BM disposed on the rear surface of the cover glass 2 covers traces (not illustrated) disposed on the touch panel board 100 such that the traces on the touch panel board 100 are not seen by a user.

The protection board 3 is attached to a display surface of a display device to be opposed to the display device so that the touch panel board 100 is used in the display device including the touch panel board.

Figure 2:
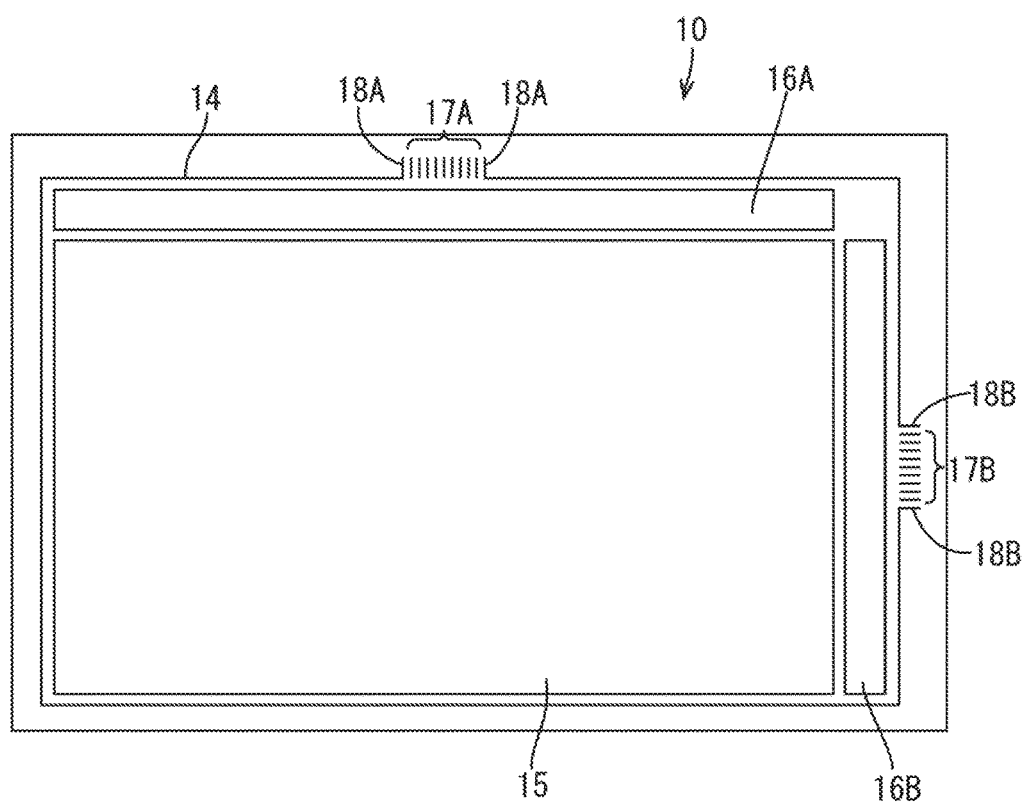
FIG. 2 is a plan view schematically illustrating a rear side surface of an electrode board.

FIG. 2 is a plan view schematically illustrating the rear-surface side of the electrode board 10. The electrode board 10 includes a support board 11, sensor electrodes 12, connection terminals 17 that are connected to the respective sensor electrodes and arranged in a row, board-side GND terminals 18 that are connected at two ends of the row of connection terminals 17, respectively, and a conductive block pattern 14 that is connected to the board-side GND terminals 18. As illustrated in FIGS. 1 and 2, the sensor electrodes 12, the connection terminals 17, the board-side GND terminals 18, and the block pattern 14 are formed on the rear surface of the support board 11.

The sensor electrode 12 is made of a transparent conductive film such as an Indium Tin Oxide (ITO) film. A metal mesh such as Cu or Ag may be used as the sensor electrode 12. The connection terminals 17, the board-side GND terminals 18, and the block pattern 14 are made of a metal film such as a copper foil or a conductive film. The support board 11 is made of a transparent resin sheet (such as polyethylene terephthalate) and has a rectangular shape in a plan view.

The connection terminals 17 are connected to one edge portion of the flexible wiring board 20 with pressure, as described later. The board-side GND terminals 18 are also connected to the one edge portion of the flexible wiring board 20 with pressure. The touch panel board 100 includes a touch controller board 31 that is different from the support board 11, and a touch controller (a detection circuit, IC) 32 as an analog front end (AFE) that is disposed on the touch controller board 31. The touch controller board 31 and the touch controller 32 are arranged on a rear-surface side as a result of folding of the flexible wiring board 20.

Another one of the edge portions of the flexible wiring board 20 is connected to the touch controller board 31 with pressure. Thus, the sensor electrodes 12 and the touch controller 32 are electrically connected to each other. Thus, as is described later, the flexible wiring board 20 is connected to a rear surface of the cover glass 2 with pressure at a portion thereof closer to the one end.

The flexible wiring board 20 includes FPC-side GND terminals (described later) that are grounded by being connected to a GND (ground) of the touch controller board 31. The FPC-side GND terminals are electrically connected to the block pattern 14 via the board-side GND terminals 18 on the support board 11.

As illustrated in FIG. 2, the support board 11 includes a sensor active area 15 on a rear surface thereof. Sensor electrodes (not illustrated) are formed in the sensor active area. As is not illustrated, first sensor electrodes extending in a first direction and second sensor electrodes extending in a second direction that is perpendicular to the first direction are formed in the sensor active area 15. Electrostatic capacity is generated between the first sensor electrodes and the second sensor electrodes.

A wiring area 16A and a wiring area 16B are provided outside the sensor active area 15. Traces connected to the first sensor electrodes are collected in the wiring area 16A and traces connected to the second sensor electrodes are collected in the wiring area 16B.

Connection terminals 17A extended from the first sensor electrodes are arranged in a row and collected outside the wiring area 16A on the support substrate 11. The board-side GND terminal 18A is disposed on each end of a row of the connection terminals 17A with respect to the arrangement direction. The board-side GND terminals 18A are connected to the block pattern 14. Connection terminals 17B extended from the second sensor electrodes are arranged in a row and collected outside the wiring area 16B on the support substrate 11. The board-side GND terminal 18B is disposed on each end of a row of the connection terminals 17B with respect to the arrangement direction. The board-side GND terminals 18B are connected to the block pattern 14.

The block electrode 14 has a frame-like shape surrounding the sensor active area 15 and the wiring areas 16A, 16B. The block pattern 14 is not formed outside the connection terminals 17A, 17B and is disconnected at each of the connection terminals 17A, 17B.

In such a touch panel board 100, electrostatic capacity is generated between the sensor electrodes 12 (between the first sensor electrodes and the second sensor electrodes). If an object to be detected such as a finger is contacted with or approaches the detection surface, an amount of the electrostatic capacity generated between the adjacent two sensor electrodes 12 changes. Such change of the electrostatic capacity is detected by the touch controller 32 and a contact position or an approached position of the object to be detected on the detection surface of the touch panel board 100 is specified. A known circuit may be used as the touch controller 32 for detecting the coordinate position of the object to be detected.

Figure 3:
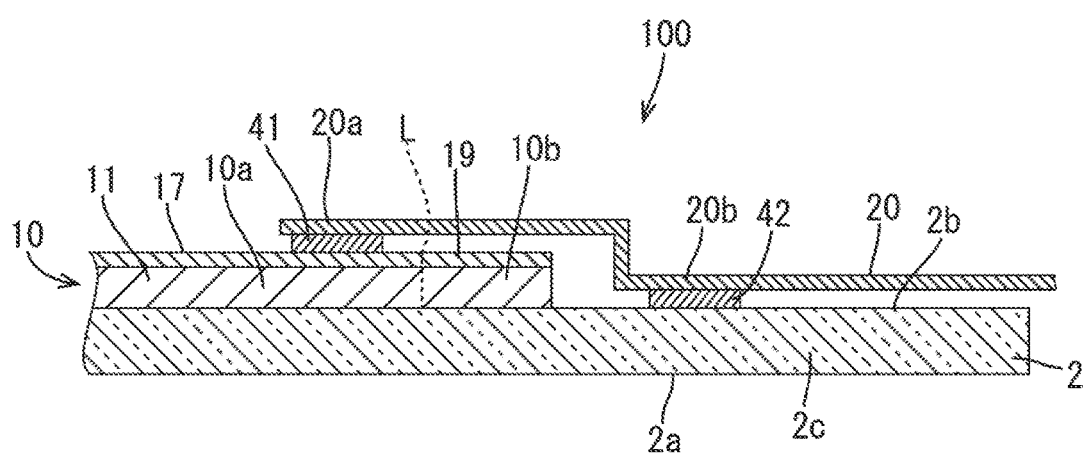
FIG. 3 is a cross-sectional view schematically illustrating a configuration of a flexible wiring board that is fixed with pressure to the electrode board and a cover glass.

Next, a connection structure of the flexible wiring board 20 of the touch panel board 100 will be described in detail. FIG. 3 is a cross-sectional view schematically illustrating a configuration of the flexible wiring board 20 that is fixed to the electrode board 10 and the cover glass 2 with pressure. In FIG. 3, an upper side corresponds with a rear surface side and a lower side corresponds with a touch surface side. As illustrated in FIG. 3, an edge portion (a first fixing portion) 20a of the flexible wiring board 20 is fixed with pressure to the connection terminals 17 and the board-side GND terminals 18 formed on the support board 11 of the electrode board 10 with using an anisotropic conductive film (ACF) 41. A middle portion (a second fixing portion) 20b of the flexible wiring board 20 near the edge portion 20a is fixed with pressure to the cover glass 2 with using an AFC 42.

The ACF 42 of this embodiment has function of a guard portion 42 that blocks static electricity flowing into the connection terminals 17, which will be described later.

Figure 4:
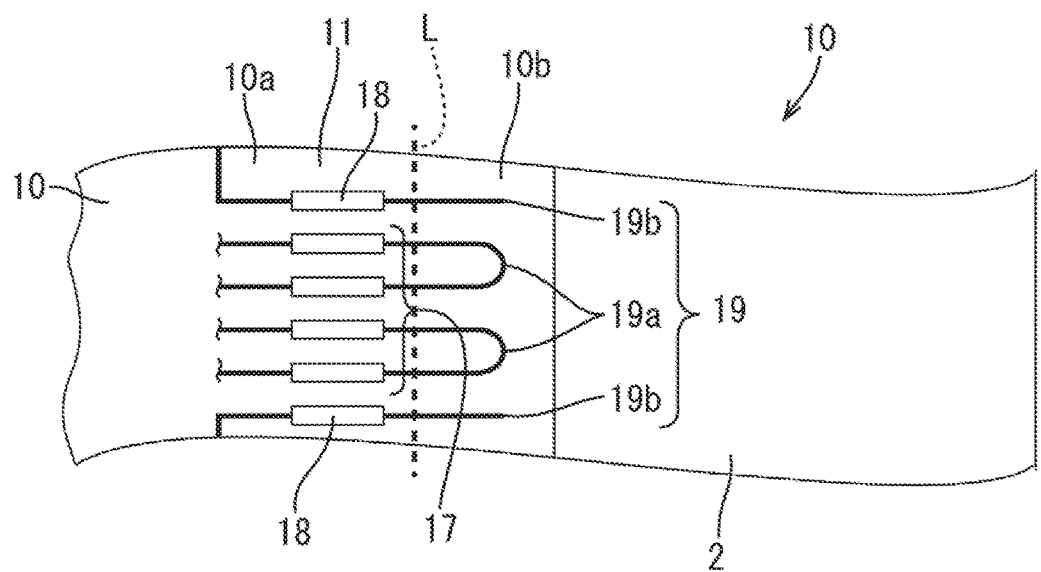
FIG. 4 is a plan view illustrating a part of a support board where connection terminals and board-side GND terminals are mounted.

FIG. 4 is a plan view illustrating a part of the support board 11 where the connection terminals 17 and the board-side GND terminals 18 are arranged.

The electrode board 10 includes a rectangular main body portion 10a and a test area portion 10b near the main body portion 10a. The sensor active area 15 and the wiring areas 16A, 16B are formed in the main body portion 10a and a test pattern 19 is formed in the test area portion 10b. The test pattern 19 is connected to the connection terminals 17 and the board-side GND terminals 18.

The test area portion 10b will be described. The test area portion 10b is provided outside the connection terminals 17B and the board-side GND terminals 18B that are formed on a short-side edge of the electrode board 10 (the main body portion 10a).

The test area portion 10b includes the test pattern 19 on the rear surface side. The test pattern 19 is used for checking disconnection of each sensor electrode in the sensor active area 15. The test pattern 19 includes pattern portions 19a each extending from the connection terminal 17 outwardly in a loop shape to connect the adjacent connection terminals 17. The test pattern 19 includes a pattern portion 19b linearly extending outwardly from each board-side GND terminal 18.

As illustrated in FIGS. 3 and 4, the test area portion 10b is formed in an outer edge portion of the electrode board 10. However, the test area portion 10b is cut off along a break line L to separate the unnecessary test pattern 19 after completion of test for checking disconnection. Namely, the final electrode board 10 includes only the main body portion 10a and the test area portion 10b is cut off from the main body portion 10a. The test area portion 10b that is to be separated at last is included outside the connection terminals 17. Therefore, the block pattern 14 is formed except for the test area portion 10b. The test area portion 10b is normally separated from the main body portion 10a before the edge portion 20a of the flexible wiring board 20 is fixed to the connection terminals 17 of the electrode board 10 with pressure.

Figure 5:
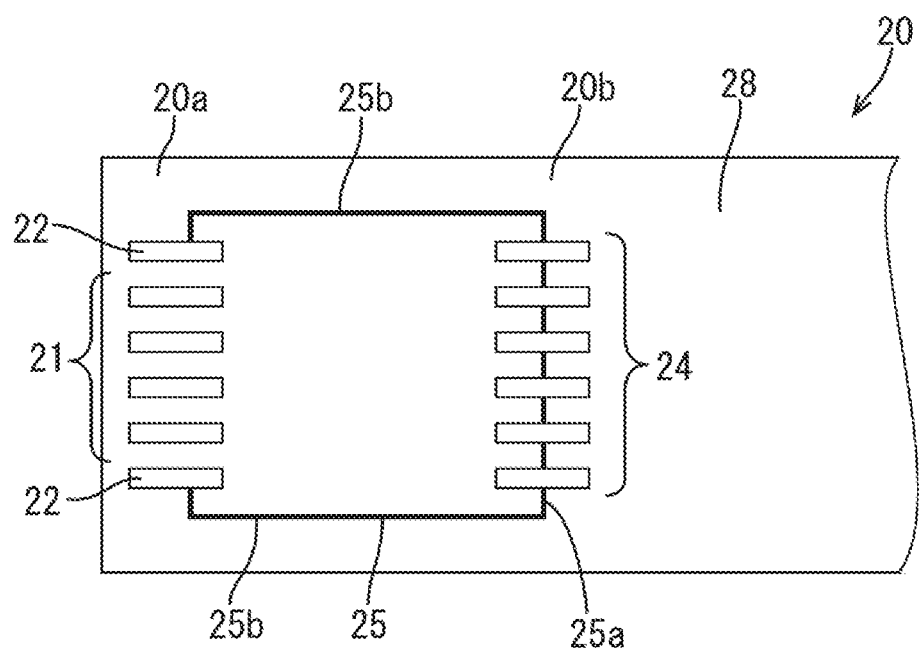
FIG. 5 is a plan view illustrating a connection terminal-side of the flexible wiring board.
Figure 6:
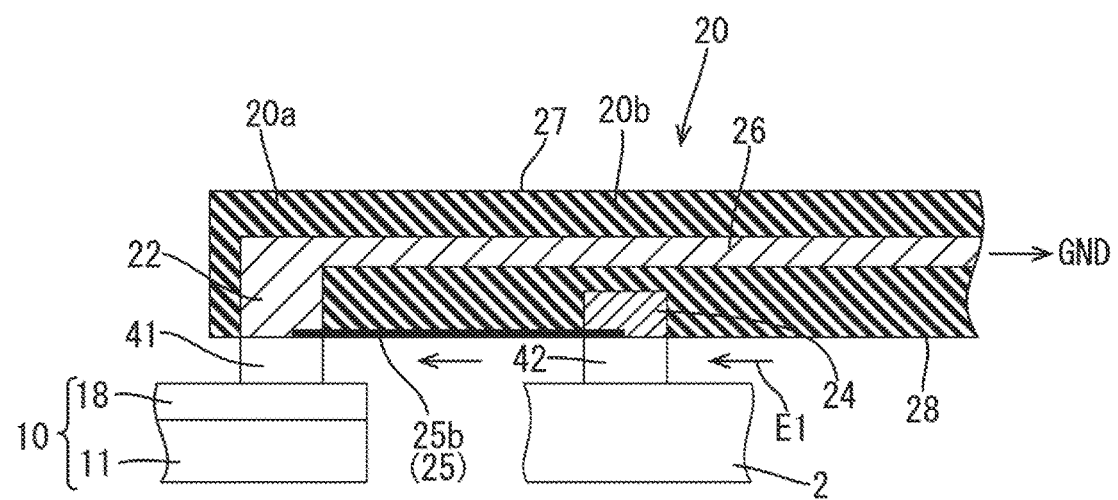
FIG. 6 is a schematic cross-sectional view of the flexible wiring board.

FIG. 5 is a plan view illustrating a connection terminal 21 side of the flexible wiring board 20 and FIG. 6 is a cross-sectional view schematically illustrating the flexible wiring board 20. As illustrated in FIG. 5, FPC-side connection terminals 21 are formed in an edge portion (a first fixing portion) 20a of the flexible wiring board 20. The FPC-side connection terminals 21 are connected to electrode board 10 side connection terminals 17. The connection terminals 21 are fixed with pressure to the connection terminals 17 with using ACF 41.

The connection terminals 21 are arranged at an end portion of a conductive wire (not illustrated) extending in an elongated direction of the flexible wiring board 20 within the flexible wiring board 20. Conductive wires (electric wires) are arranged within the flexible wiring board 20. As illustrated in FIG. 5, a FPC-side GND terminal 22 is arranged on each end side of a row of connection terminals 21. A ground wire 26 that is a linear conductive member extends in an elongated direction of the flexible wiring board 20 within the flexible wiring board 20. The FPC-side GND terminal 22 is located at an end portion of the ground wire 26. In this embodiment, two ground wires 26 are arranged within the flexible wiring board 20.

The connection terminal 21 and the FPC-side GND terminals are exposed from an insulation layer 28 that is made of resin and configures a touch surface side of the flexible wiring board 20. Another insulation layer 27 made of resin is disposed on a side opposite from the insulation layer 28 on the touch surface side. Namely, the insulation layer 27 and the insulation layer 28 are bonded together with sandwiching the conductive wires and the grand wires 26 therebetween and cover the conductive wires and the grand wires 26.

As illustrated in FIG. 5, pads 24 made of metal foil such as copper foil are mounted on a portion (a second fixing portion) of the flexible wiring board 20. The number of the pads 24 is same as the total number of the connection terminals 21 and the FPC-side GND terminals 22 in this embodiment. The pads 24 are arranged on the insulation layer 28 at an interval therebetween in a width direction of the flexible wiring board 20. The pads 24 are fixed with pressure on the cover glass 2 with using the ACF 42.

Aground connection wire 25 is mounted on the flexible wiring board 20. The ground connection wire 25 is connected to ground and protects the connection terminals 21 (and the connection terminals 17) from static electricity. The ground wire 25 is a linear pattern made of metal foil such as copper foil and having a certain line width. The ground connection wire 25 includes a contact portion 25a and a connect portion 25b, and the contact portion 25a is in contact with the ACF 42 and the connect portion 25b connects the contact portion 25a and the FPC-side GND terminal 22. The contact portion 25a extends in the width direction of the flexible wiring board 20 and crosses the pads 24 to be connected to each pad 24. The connection portion 25b is arranged on each end of the contact portion 25a and connected to each of the FPC-side GND terminal 22. The ground connection wire 25 is formed on the insulation layer 28.

The flexible wiring board 20 is a flat board having flexibility and the ground connection wire 25 can be warped as the flexible wiring board 20 is warped.

As illustrated in FIG. 3, an edge portion (a projected edge portion) 2c of the cover glass 2 is outside an edge portion of the electrode board 10 and the edge portion (the projected edge portion) 2c is arranged outside the connection terminals 17 of the electrode board 10. The portion (the second fixing portion) 20b of the flexible wiring board 20 having the contact portion 25a of the ground connection wire 25 is fixed with pressure to the edge portion 2c of the cover glass 2 from the opposing surface 2b side with using the ACF (a guard portion) 42. The flexible wiring board 20 extends from the support board 11 side toward the edge portion (the projected edge portion) 2c of the cover glass 2.

The position of the electrode board 10 differs from the position of the cover glass 2 in the thickness direction (a layered direction) of the touch panel board 100. The two portions where the flexible wiring board 20 is fixed with pressure form a step. The flexible wiring board 20 having flexibility can be deformed as appropriate such that the first fixing portion 20a and the second fixing portion 20b are fixed with pressure to the two portions at different levels.

In the touch panel board 100 having such a configuration, static electricity E may flow into the rear surface side of the support board 11 from the touch surface 1a (the touch surface 2a of the cover glass 2 that is on an opposite side from the opposing surface 2b) via a side edge surface of the cover glass 2 and the opposing surface 2b of the cover glass 2. However, with the above configuration, the static electricity E is blocked by the ACF (the guard portion) 42 and the block pattern 14 and discharged to the GND potential via the ground wires 26 of the flexible wiring board 20 without flowing into the connection terminals 17.

As described before, in the touch panel board 100 of this embodiment, the connection terminals 17 of the electrode board 10 are not surrounded by the block pattern 14. However, the ACF 42 that is the guard portion 42 is arranged on the projected edge portion 2c of the cover glass 22 outside the connection terminals 17 to be parallel to the connection terminals 17. Therefore, the ACF (the guard portion) 42 blocks static electricity directed toward the connection terminals 17.

In detail, static electricity E1 flows from the touch surface 1a (the touch surface 2a of the cover glass 2) and is transferred via the side edge surface of the touch panel board 100 (the side edge surface of the cover glass 2) and the rear surface (the opposing surface 2b) of the cover glass 2 toward the connection terminals 17 of the electrode board 10. Such static electricity E1 is captured by the ACF (the guard portion) 42. The captured static electricity E1 flows through the ground connection line 25 (the contact portion 25a, the connection portion 25b) that is on the flexible wiring board 20 and connected to the ACF 42 and reaches the FPC-side GND terminals 22. The static electricity E1 flows through the ground wires 26 in the flexible wiring board 20 and is discharged to the GND potential at last.

As is described before, in the touch panel board 100 of the preset embodiment, the electrostatic electricity that would enter from the outside and flow toward the connection terminals 17 can be effectively blocked with using the ACF (the guard portion) 42. As a result, a voltage of the static electricity is prevented from being applied to the touch controller 32 via the connection terminals 17 and the flexible wiring board 20 and electrostatic breakdown of the touch controller (a detection circuit) 32 is less likely to occur.

In this embodiment, the flexible wiring board 20 is fixed with pressure at the first fixing portion 20a and also the second fixing portion 20b. Therefore, reaction force is less likely to be transferred to the first fixing portion 20a. As a result, in the touch panel board 100 of this embodiment, the flexible wiring board 20 is less likely to be peeled from the electrode board 10 at the first fixing portion 20a and electric disconnection (disconnection between the connection terminals 21 of the flexible wiring board 20 and the connection terminals 17 of the electrode board 10) is less likely to occur.

Second Embodiment

Figure 7:
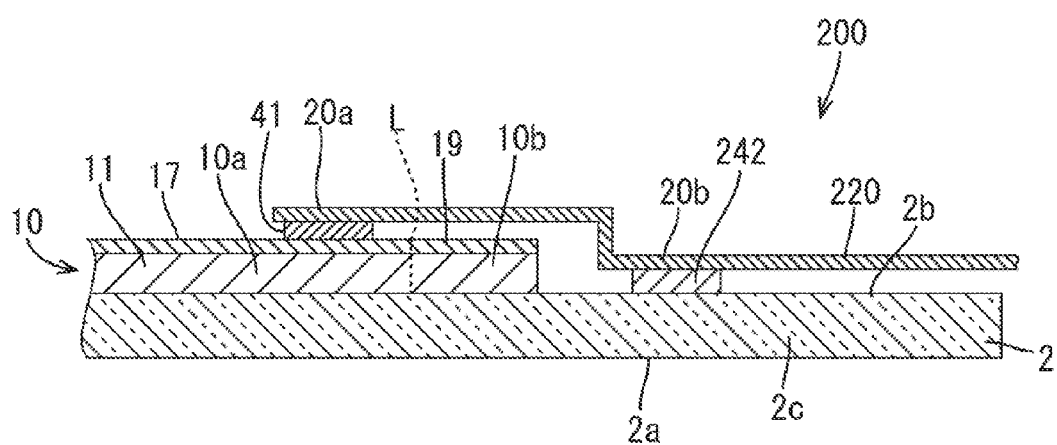
FIG. 7 is a cross-sectional view schematically illustrating a configuration of a flexible wiring board that is fixed to the electrode board and a cover glass of a touch panel board according to a second embodiment.
Figure 8:
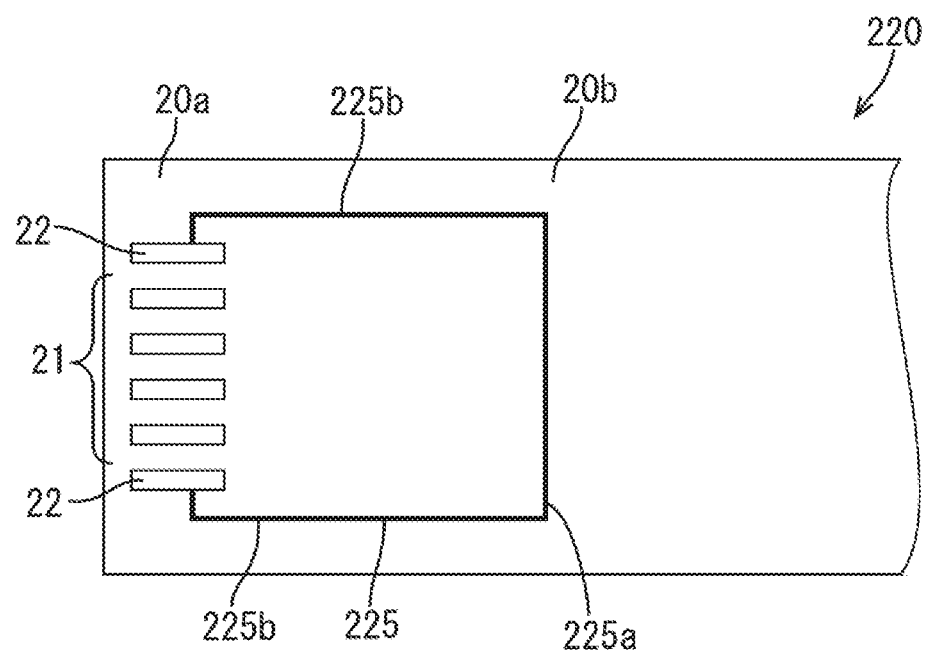
FIG. 8 is a plan view of a connection terminal side of the flexible wiring board.
Figure 9:
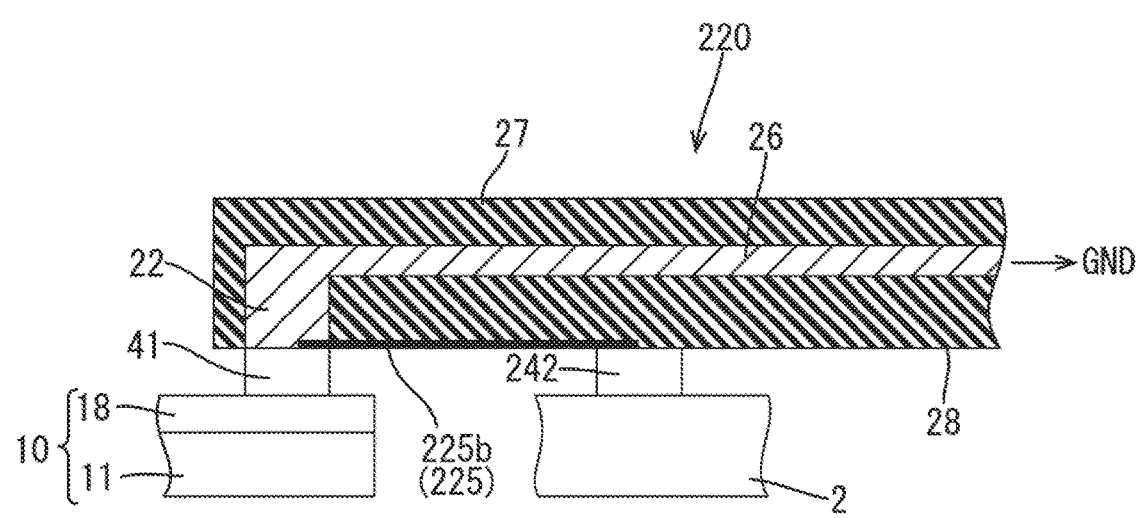
FIG. 9 is a schematic cross-sectional view of the flexible wiring board.

Next, a second embodiment of the present technology will be described with reference to FIGS. 7 to 9. In the description of the following embodiments, configurations same as those of the first embodiment have same symbols and will not be described in detail. FIG. 7 is a cross-sectional view schematically illustrating a configuration of a flexible wiring board 220 fixed to the electrode board 10 and the cover glass 2 of a touch panel board 200 according to the second embodiment. FIG. 8 is a plan view illustrating a connection terminal 21 side of the flexible wiring board 220. FIG. 9 is a schematic cross-sectional view of the flexible wiring board 220.

In the touch panel board 200 of this embodiment, a configuration of a ground connection line 225 formed on the flexible wiring board 220 and a configuration of a guard portion 242 fixing the flexible wiring board 220 to the edge portion 2c of the cover glass 2 differ from those of the first embodiment. Specifically, the pads 24 of the first embodiment are not provided in this embodiment and a contact portion 225a of the ground connection line 225 of this embodiment is formed only in a linear pattern. Connection portions 225b are similar to those of the first embodiment. The guard portion 242 is made of a conductive adhesive layer. The conductive adhesive layer is an adhesive layer including conductive fillers, for example. The conductive adhesive layer as the guard portion 242 has a thickness such that a height position thereof from the opposing surface of the cover glass 2 is lower than the position of the plate surface (the rear surface) of the electrode board 10 and thus, a first fixing portion 220a is not peeled off.

As is in this embodiment, the guard portion 242 made of the conductive adhesive layer may be used. The flexible wiring board of the first embodiment may be used for the flexible wiring board 220 as far as the object of the present technology can be achieved.

Third Embodiment

Figure 10:
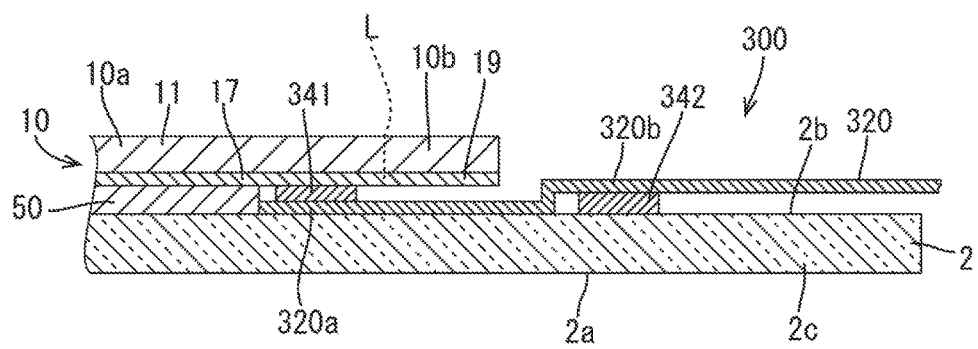
FIG. 10 is a cross-sectional view schematically illustrating a configuration of a flexible wiring board that is fixed to an electrode board and a cover glass of a touch panel board according to a third embodiment.
Figure 11:
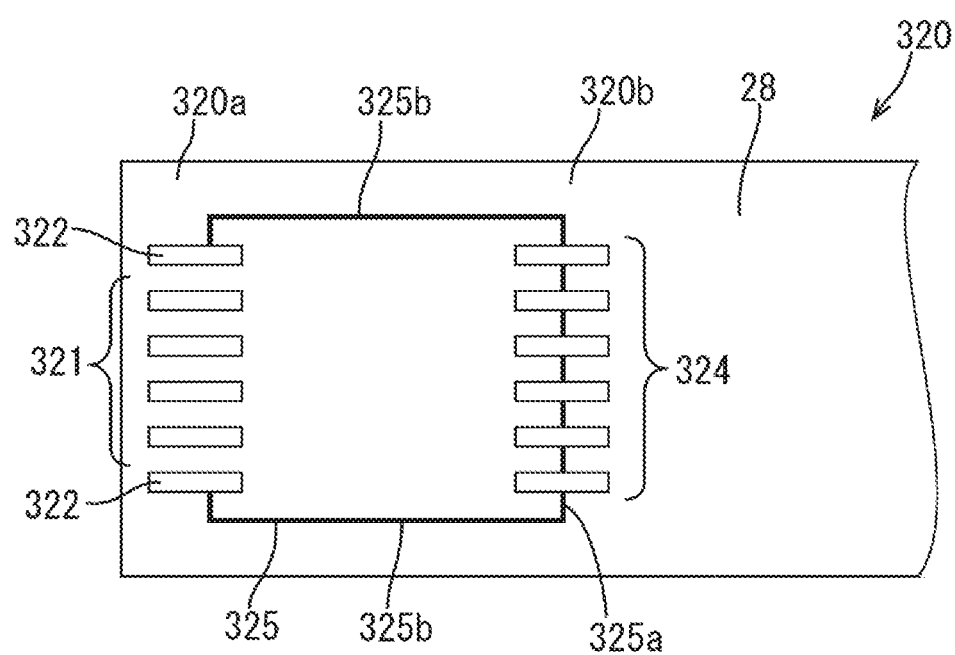
FIG. 11 is a plan view illustrating a ground connection wire-side of the flexible wiring board.
Figure 12:
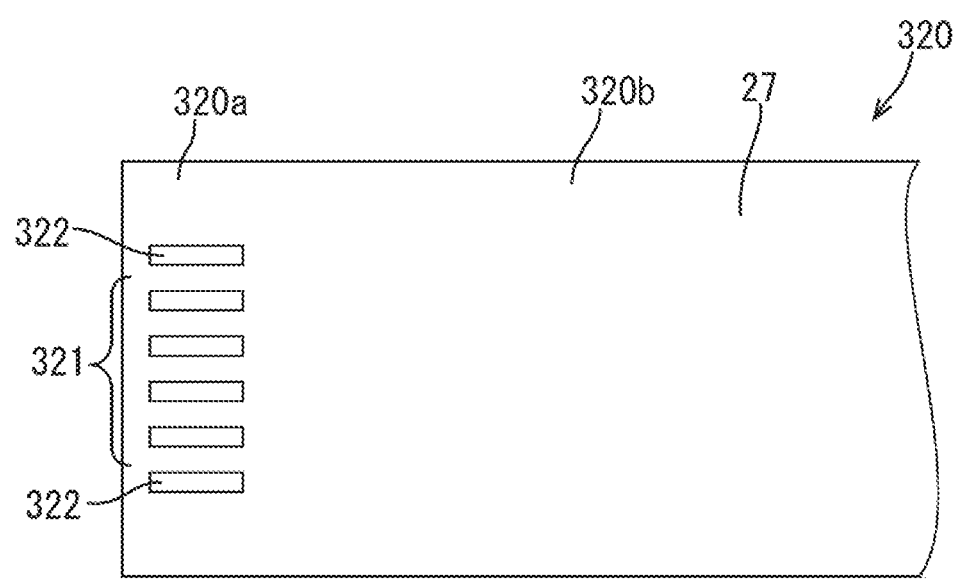
FIG. 12 is a plan view of the flexible wiring board seen from an opposite side from FIG. 11.
Figure 13:
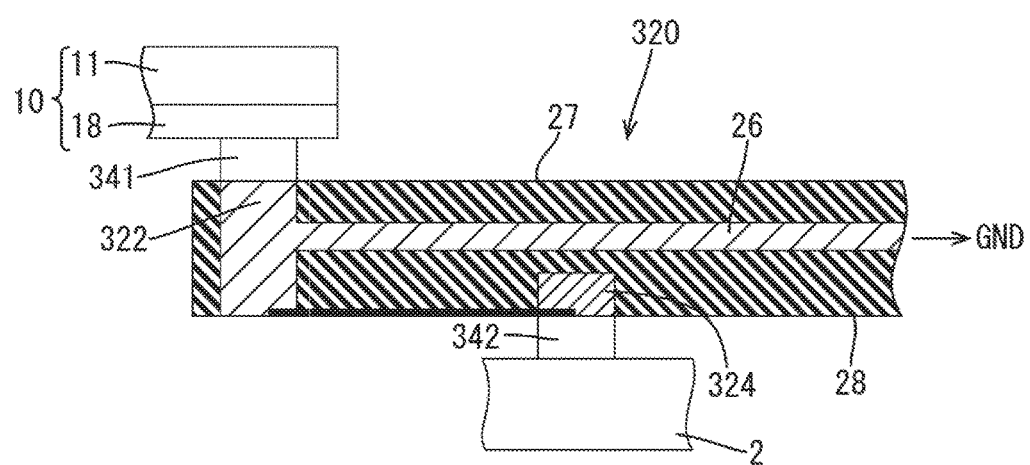
FIG. 13 is a schematic cross-sectional view of the flexible wiring board.

Next, a third embodiment of the present technology will be described with reference to FIGS. 10 to 13. FIG. 10 is a cross-sectional view schematically illustrating a configuration of a flexible wiring board 300 fixed to the electrode board 10 and the cover glass 2 of a touch panel board 300 of the third embodiment. FIG. 11 is a plan view illustrating a ground connection line 325 side of a flexible wiring board 320. FIG. 12 is a plan view of the flexible wiring board 320 seen from an opposite side from FIG. 11. FIG. 13 is a cross-sectional view schematically illustrating the flexible wiring board 320.

In the touch panel board 300 of this embodiment, the electrode board 10 is disposed on the cover glass 2 in an opposite way from that in the first embodiment. Namely, in this embodiment, the electrode board 10 is disposed on the opposing surface 2b side of the cover glass 2 such that the connection terminals 17 and the test patterns face the opposing surface 2b. An intermediate layer 50 is disposed between the cover glass 2 and the electrode board 10 to adjust a gap therebetween.

The flexible wiring board 320 of this embodiment has an opposite surface opposite form a surface having a ground connection wire 325. Connection terminals 321 and FPC-side GND terminals 322 are connected to the connection terminals 17 of the electrode board 10 on the opposite surface.

As illustrated in FIG. 11, a linear contact portion 325a that is the ground connection wire 325 is formed in a second fixing portion 320b of the flexible wiring board 320. Pads 324 are provided on a contact portion 325a similarly to the first embodiment. Connection terminals 321 and two FPC-side GND terminals 322 are formed in a first fixing portion 320a of the flexible wiring board 320. The connection terminals 321 and the FPC-side GND terminals 322 are formed to be through thickness of the flexible wiring board 320.

As illustrated in FIG. 12, the connection terminals 321 and the FPC-side GND terminals 322 are formed to be exposed from the insulation layer 27 in the first fixing portion 320a that is in an edge portion of the flexible wiring board 320. The connection portions 325b of the ground connection line 325 is formed on the insulation layer 28 facing the cover glass 2 to connect the FPC-side GND terminals 322 and the contact portion 325a.

The first fixing portion 320a of the flexible wiring board 320 is fixed with pressure to the connection terminals 17 of the electrode board 10 with using ACF 341. The second fixing portion 320b of the flexible wiring board 320 is fixed with pressure to the projected edge portion 2c of the cover glass 2 with using ACF 342 that functions as a guard portion 342.

As described before, the electrode board 10 is disposed on the cover glass 2 such that the connection terminals 17 face the cover glass 2, and in the touch panel board 300 having such a configuration, the guard portion (ACF) 324, the ground connection wire 325 and the ground wires 26 arranged within the flexible wiring board 320 may be used to effectively restrict flow of static electricity into the connection terminals 17.

Fourth Embodiment

Figure 14:
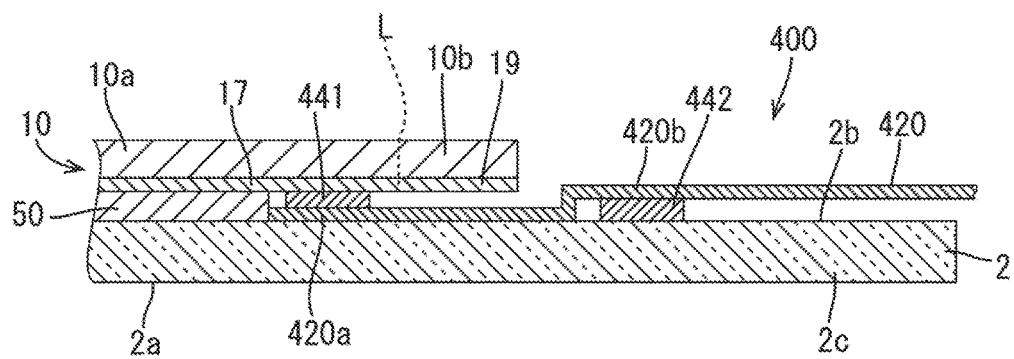
FIG. 14 is a cross-sectional view schematically illustrating a configuration of a flexible wiring board that is fixed to an electrode board and a cover glass of a touch panel board according to a fourth embodiment.
Figure 15:
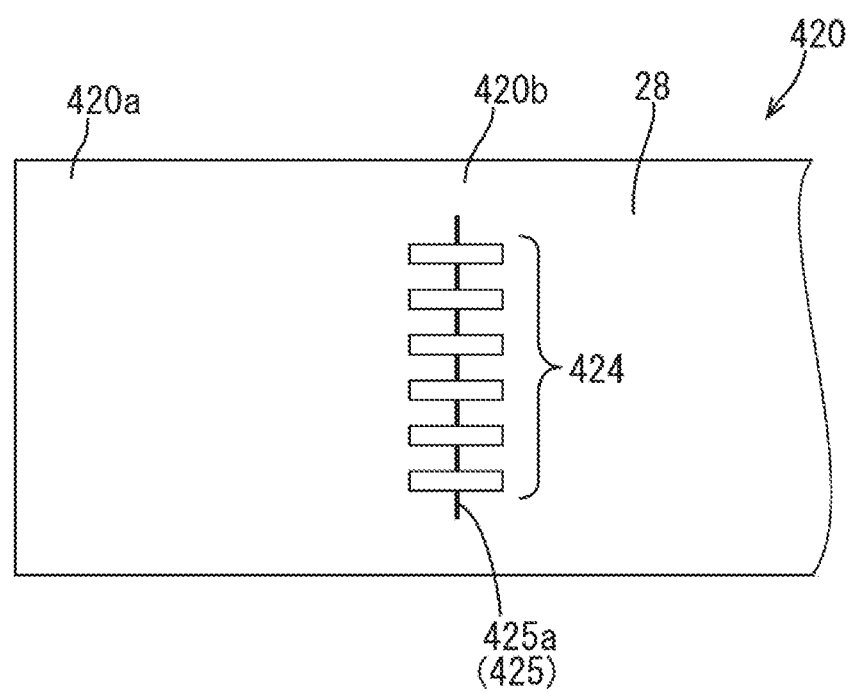
FIG. 15 is a plan view illustrating a ground connection wire side of the flexible wiring board.
Figure 16:
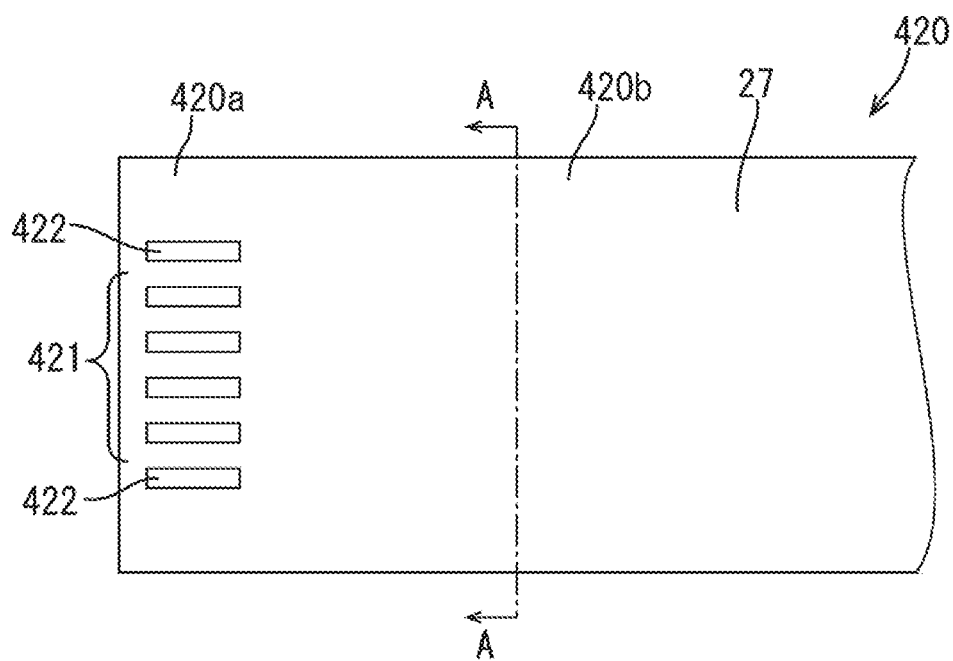
FIG. 16 is a plan view of the flexible wiring board seen from an opposite side from FIG. 15.
Figure 17:
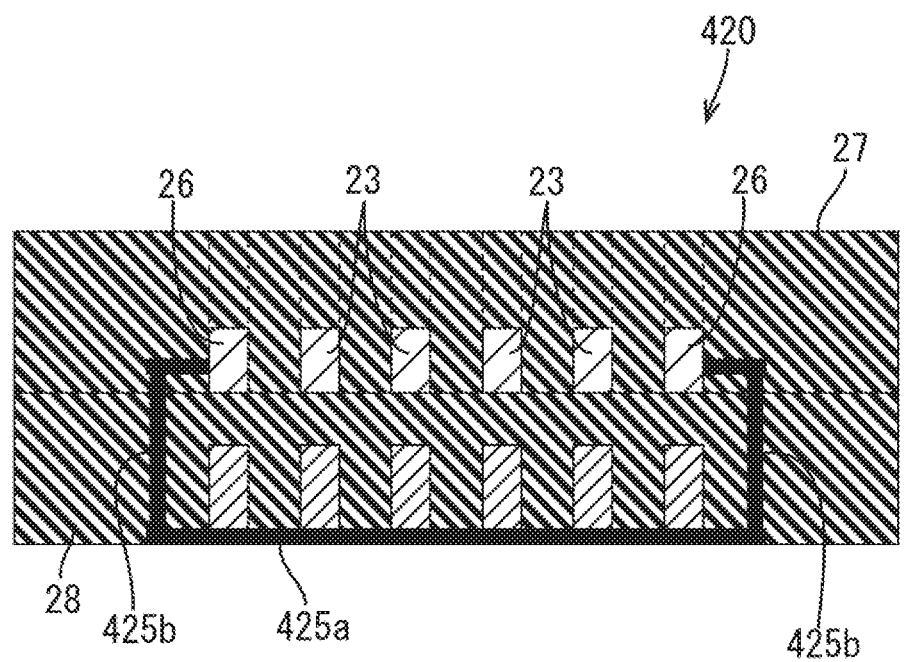
FIG. 17 is a cross-sectional view taken along line A-A in FIG. 16.
Figure 18:
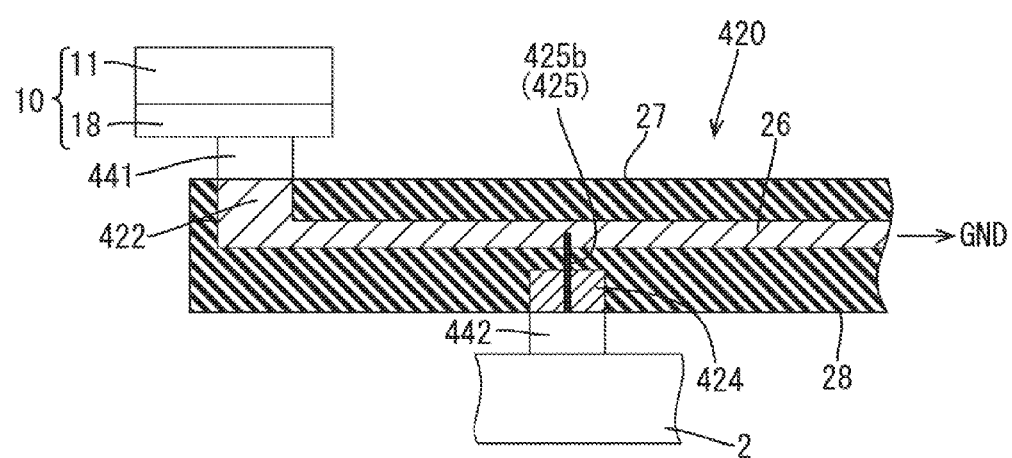
FIG. 18 is a schematic cross-sectional view of the flexible wiring board.

Next, a fourth embodiment of the present technology will be described with reference to FIGS. 14 to 18. FIG. 14 is a cross-sectional view schematically illustrating a configuration of a flexible wiring board 420 that is fixed to the electrode board 10 and the cover glass 2 of a touch panel board 400 according to the fourth embodiment. FIG. 15 is a plan view illustrating a ground connection wire 425 side of the flexible wiring board 420. FIG. 16 is a plan view of the flexible wiring board 420 seen from an opposite side from FIG. 15. FIG. 17 is a cross-sectional view taken along line A-A in FIG. 16. FIG. 18 is a schematic cross-sectional view of the flexible wiring board 420.

In the touch panel board 400 of this embodiment, similar to the third embodiment, the electrode board 10 is disposed on the opposing surface 2b side of the cover glass 2 such that the connection terminals 17 and the test patterns face the opposing surface 2b. The intermediate layer 50 is disposed between the cover glass 2 and the electrode board 10 to adjust a gap therebetween.

The flexible wiring board 320 of this embodiment has an opposite surface opposite form a surface having a ground connection wire 325, and a connection terminals 321 and FPC-side GND terminals are connected to the connection terminals 17 of the electrode board 10 on the opposite surface.

As illustrated in FIG. 15, a linear contact portion 425a that is the ground connection wire 425 is formed in a second fixing portion 420b of the flexible wiring board 420. Pads 424 are provided on a contact portion 425a similarly to the first embodiment.

As illustrated in FIG. 16, the connection terminals 421 and the FPC-side GND terminals 422 are formed to be exposed from the insulation layer 27 in the first fixing portion 420a that is in an edge portion of the flexible wiring board 420. The connection terminals 421 are included in end portions of conductive wires 23 within the flexible wiring board 420. The FPC-side GND terminals 422 are included in end portions of the ground wires 26 within the flexible wiring board 420.

As illustrated in FIG. 17, connection portions 425b of the ground connection wire 425 are formed inside the flexible wiring board 420 (namely, within the insulation layers 27, 28). The connection portions 425b are made of metal conductive member. The connection portions 425b are formed inside the flexible wiring board 420 (within the insulation layers 27, 28) to connect the ground wires 26 and the contact portions 425a within the flexible wiring board 420.

The first fixing portion 420a of the flexible wiring board 420 is fixed with pressure to the connection terminals 17 of the electrode board 10 with using ACF 441. The second fixing portion 420b of the flexible wiring board 420 is fixed with pressure to the projected edge portion 2c of the cover glass 2 with using ACF 442 that functions as a guard portion 442.

As described before, the electrode board 10 is disposed on the cover glass 2 such that the connection terminals 17 face the cover glass 2, and in the touch panel board 400 having such a configuration, the guard portion (ACF) 424, the ground connection wire 425 and the ground wires 26 arranged within the flexible wiring board 420 may be used to effectively restrict flow of static electricity into the connection terminals 17.

As is in this embodiment, the connection portions 425b of the ground connection wire 425 may be formed inside the flexible wiring board 420 (within the insulation layers 27, 28) and directly connected to the ground wires 26.

Fifth Embodiment

Figure 19:
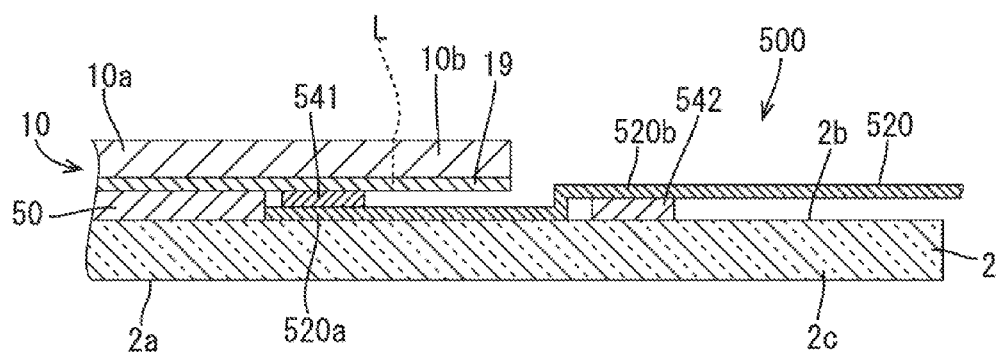
FIG. 19 is a cross-sectional view schematically illustrating a configuration of a flexible wiring board that is fixed to an electrode board and a cover glass of a touch panel board according to a fifth embodiment.
Figure 20:
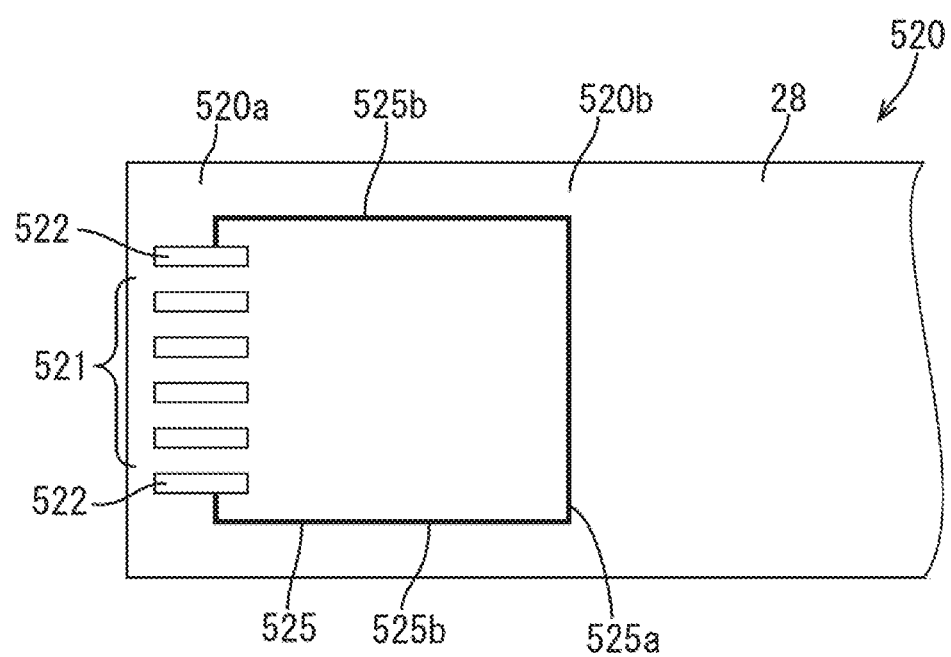
FIG. 20 is a plan view illustrating a ground connection wire-side of the flexible wiring board.
Figure 21:
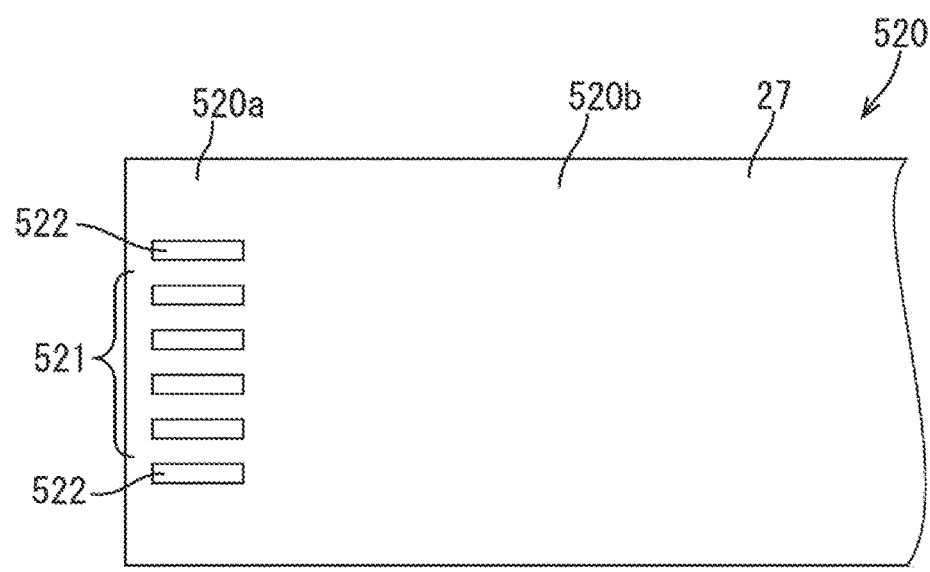
FIG. 21 is a plan view of the flexible wiring board seen from an opposite side from FIG. 20.
Figure 22:
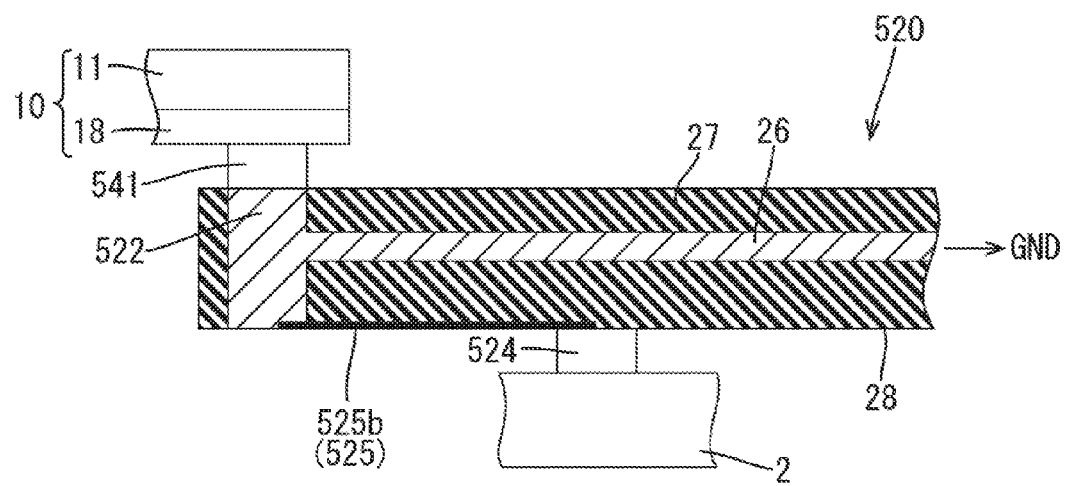
FIG. 22 is a schematic cross-sectional view of the flexible wiring board.

Next, a fifth embodiment of the present technology will be described with reference to FIGS. 19 to 22. FIG. 19 is a cross-sectional view schematically illustrating a configuration of a flexible wiring board 500 that is fixed to the electrode board 10 and the cover glass 2 of the touch panel board 500 according to a fifth embodiment. FIG. 20 is a plan view illustrating a ground connection wire 525 side of the flexible wiring board 520. FIG. 21 is a plan view of the flexible wiring board 520 seen from an opposite side from FIG. 20. FIG. 22 is a schematic cross-sectional view of the flexible wiring board 520.

In the touch panel board 500 of this embodiment, the electrode board 10 is disposed on an opposing surface 2b side of the cover glass 2 such that the connection terminals 17 and the test patterns face the opposing surface 2b. The intermediate layer 50 is disposed between the cover glass 2 and the electrode board 10 to adjust a gap therebetween.

The flexible wiring board 520 of this embodiment has an opposite surface opposite form a surface having a ground connection wire 525, and a connection terminals 521 and FPC-side GND terminals 522 are connected to the connection terminals 17 of the electrode board 10 on the opposite surface.

As illustrated in FIG. 20, a linear contact portion 525a that is the ground connection wire 525 is formed in a second fixing portion 520b of the flexible wiring board 520. Connection terminals 521 and two FPC-side GND terminals 522 are formed in a first fixing portion 520a of the flexible wiring board 520. The connection terminals 521 and the FPC-side GND terminals 522 are formed to be through thickness of the flexible wiring board 520.

As illustrated in FIG. 21, the connection terminals 521 and the FPC-side GND terminals 522 are formed to be exposed from the insulation layer 27 in the first fixing portion 520a that is in an edge portion of the flexible wiring board 520. The connection portions 525b of the ground connection line 525 is formed on the insulation layer 28 facing the cover glass 2 to connect the FPC-side GND terminals 522 and the contact portion 525a (see FIG. 20).

The first fixing portion 520a of the flexible wiring board 520 is fixed with pressure to the connection terminals 17 of the electrode board 10 with using ACF 541. The second fixing portion 520b of the flexible wiring board 520 is fixed with pressure to the projected edge portion 2c of the cover glass 2 with using a conductive adhesive layer 542 that functions as a guard portion 542. The conductive adhesive layer as the guard portion 542 has a thickness such that a height position thereof from the opposing surface of the cover glass 2 is lower than the position of the plate surface (the rear surface) of the electrode board 10 and thus, the first fixing portion 520a is not peeled off.

As described before, the electrode board 10 is disposed on the cover glass 2 such that the connection terminals 17 face the cover glass 2, and in the touch panel board 500 having such a configuration, the guard portion (the conductive adhesive layer) 524, the ground connection wire 525 and the ground wires 26 arranged within the flexible wiring board 520 may be used to effectively restrict flow of static electricity into the connection terminals 17.

Sixth Embodiment

Figure 23:
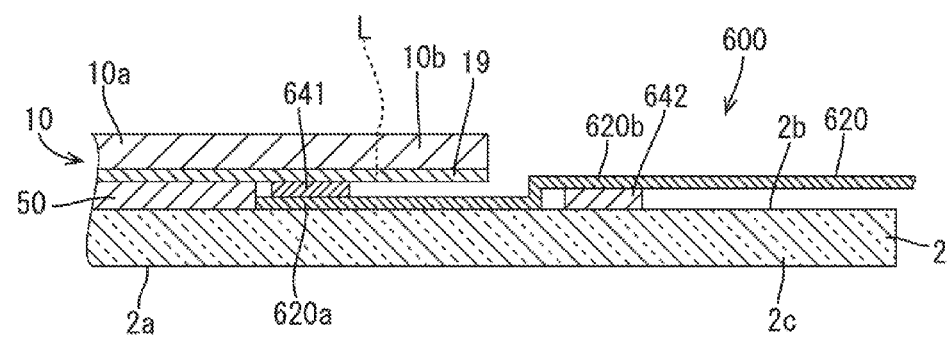
FIG. 23 is a cross-sectional view schematically illustrating a configuration of a flexible wiring board that is fixed to an electrode board and a cover glass of a touch panel board according to a sixth embodiment.
Figure 24:
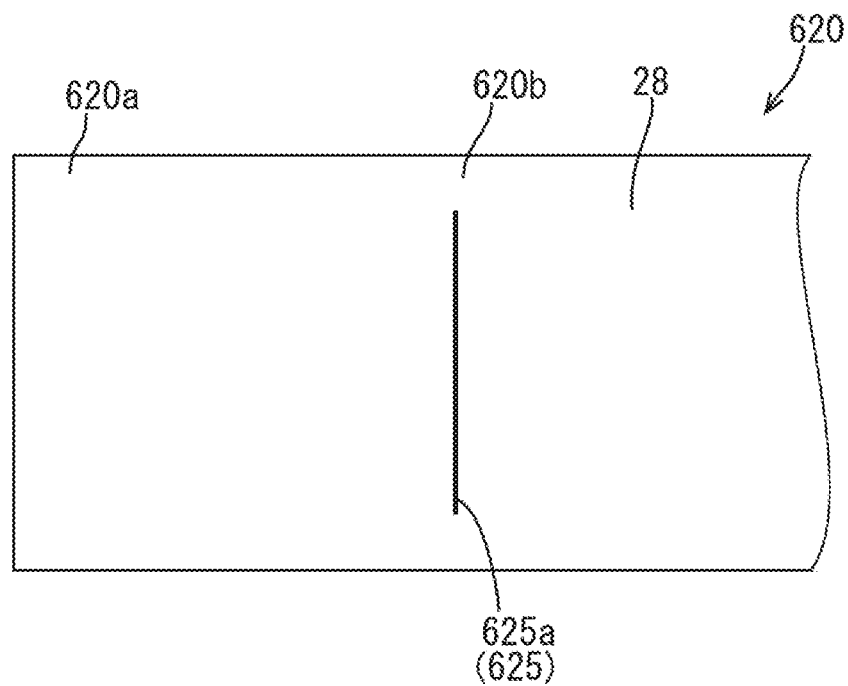
FIG. 24 is a plan view illustrating a ground connection wire side of the flexible wiring board.
Figure 25:
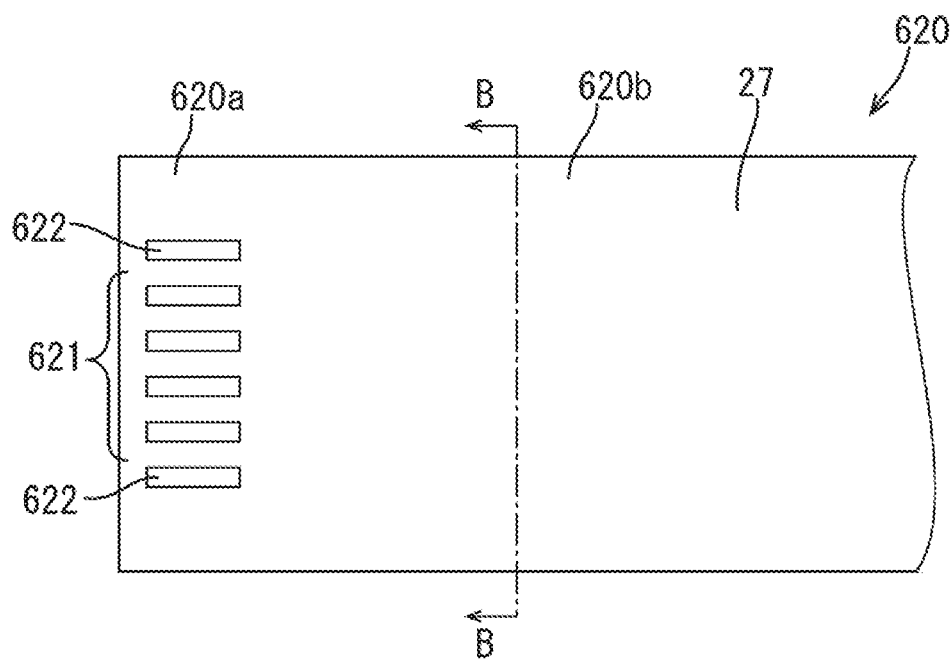
FIG. 25 is a plan view of the flexible wiring board seen from an opposite side from FIG. 24.
Figure 26:
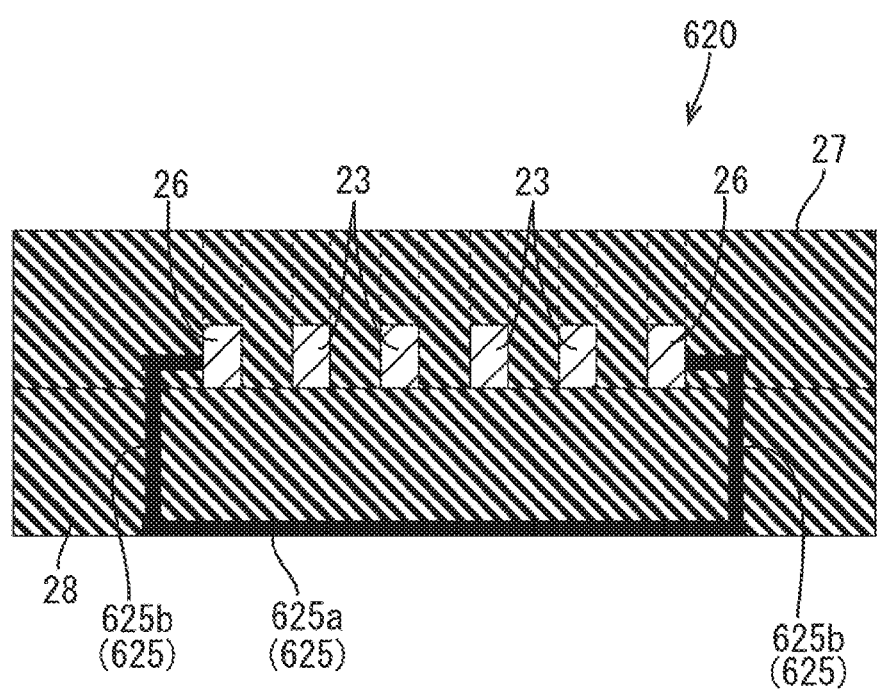
FIG. 26 is a cross-sectional view taken along line B-B in FIG. 25.
Figure 27:
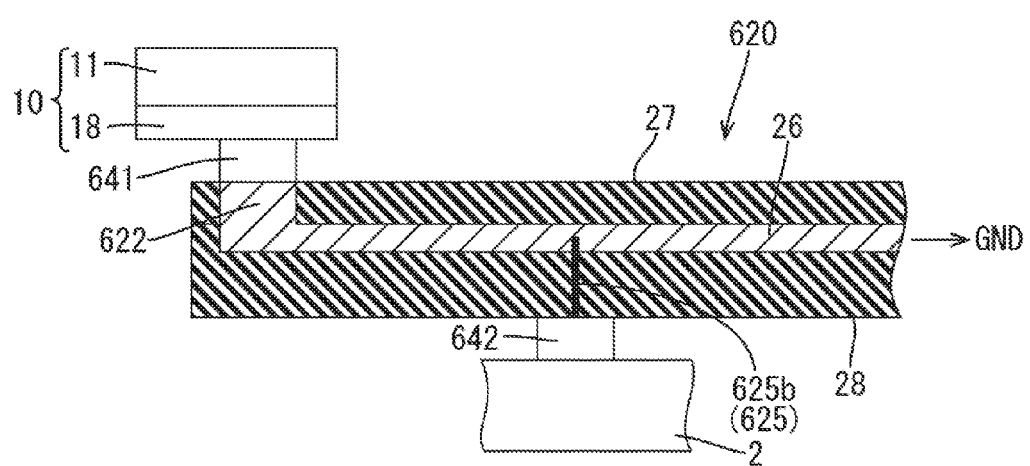
FIG. 27 is a schematic cross-sectional view of the flexible wiring board.

Next, a sixth embodiment of the present technology will be described with reference to FIGS. 23 to 27. FIG. 23 is a cross-sectional view schematically illustrating a configuration of a flexible wiring board 520 that is fixed to the electrode board 10 and the cover glass 2 of a touch panel board 600 according to the sixth embodiment. FIG. 24 is a plan view illustrating a ground connection wire 625 side of the flexible wiring board 620. FIG. 25 is a plan view of the flexible wiring board 620 seen from an opposite side from FIG. 24. FIG. 26 is a cross-sectional view taken along line B-B in FIG. 25. FIG. 27 is a schematic cross-sectional view of the flexible wiring board 620.

In the touch panel board 600 of this embodiment, the electrode board 10 is disposed on the opposing surface 2b side of the cover glass 2 such that the connection terminals 17 and the test patterns face the opposing surface 2b. The intermediate layer 50 is disposed between the cover glass 2 and the electrode board 10 to adjust a gap therebetween.

The flexible wiring board 620 of this embodiment has an opposite surface opposite form a surface having a ground connection wire 625, and a connection terminals 621 and FPC-side GND terminals 622 are connected to the connection terminals 17 of the electrode board 10 on the opposite surface.

As illustrated in FIG. 24, a linear contact portion 625a that is the ground connection wire 625 is formed in a second fixing portion 620b of the flexible wiring board 620.

As illustrated in FIG. 25, the connection terminals 621 and the FPC-side GND terminals 622 are formed to be exposed from the insulation layer 27 in the first fixing portion 620a that is in an edge portion of the flexible wiring board 620. The connection terminals 621 are included in end portions of the conductive wires 23 within the flexible wiring board 620. The FPC-side GND terminals 622 are included in end portions of the ground wires 26 within the flexible wiring board 620.

As illustrated in FIG. 26, connection portions 625b of the ground connection wire 425 are formed inside the flexible wiring board 620 (namely, within the insulation layers 27, 28). The connection portions 625b are made of metal conductive member. The connection portions 625b are formed inside the flexible wiring board 620 (within the insulation layers 27, 28) to connect the ground wires 26 and the contact portions 625a within the flexible wiring board 620.

The first fixing portion 620a of the flexible wiring board 620 is fixed with pressure to the connection terminals 17 of the electrode board 10 with using ACF 641. The second fixing portion 620b of the flexible wiring board 620 is fixed with pressure to the projected edge portion 2c of the cover glass 2 with using conductive adhesive layer 642 that functions as a guard portion 642. The conductive adhesive layer as the guard portion 642 has a thickness such that a height position thereof from the opposing surface of the cover glass 2 is lower than the position of the plate surface (the rear surface) of the electrode board 10 and thus, the first fixing portion 620a is not peeled off.

As described before, the electrode board 10 is disposed on the cover glass 2 such that the connection terminals 17 face the cover glass 2, and in the touch panel board 600 having such a configuration, the guard portion (the conductive adhesive layer) 624, the ground connection wire 625 and the ground wires 26 arranged within the flexible wiring board 620 may be used to effectively restrict flow of static electricity into the connection terminals 17.

As is in this embodiment, the connection portions 625b of the ground connection wire 625 may be formed inside the flexible wiring board 620 (within the insulation layers 27, 28) and directly connected to the ground wires 26.

OTHER EMBODIMENTS

The present invention is not limited to the embodiment described above with reference to the drawings and the following embodiments may be included in the technical filed of the present invention.

(1) In each of the above embodiments, the ground connection wire is formed on the flexible wiring board. However, the present technology is not limited thereto and an exclusive cable may be included for the ground connection wire in other embodiments. The ground connection wire may be preferably formed integrally with the flexible wiring board as is in each of the above embodiments. Such a ground connection wire can be handled together with the flexible wiring board and handling properties are improved. With the configuration that the ground connection wire is integrally formed with the flexible wiring board, the touch panel board can be reduced in size.

(2) In each of the above embodiments, the guard portion for protecting the connection terminals with respect to a short-side direction of the electrode board is described. A guard portion having a similar configuration may be included in the connection terminals in the long-side direction to block static electricity.

(3) The sensor electrode formed on the electrode board is not limited as far as it is used in the known type touch panel board such as electrostatic capacitance type.

(4) In each of the above embodiments, the two ground wires are arranged in the flexible wiring board. In other embodiments, the number of the ground wire may be one, three or more. Namely, the number of the ground wire may be set according to an object and may be single or multiple.

(5) In the third embodiment and the next embodiments, the intermediate layer is between the electrode board and the cover panel. However, the intermediate layer may have a laminated structure including two layers or more.

EXPLANATION OF SYMBOLS

1: AR film, 1a: touch surface, 2: cover glass (cover panel), 2a: touch surface, 2b: opposing surface, 2c: projected end portion, 3: protection board, 10: electrode board, 10a: body portion, 10b: test area portion, 11: support board, 12: sensor electrode, 14: block pattern, 15: sensor active area, 16, 16A, 16B: wiring area, 17, 17A, 17B: connection terminal, 18, 18A, 18B: board-side GND terminal, 19: test pattern, 20: flexible wiring board, 20a: first fixing portion, 20b: second fixing portion, 21: connection terminal, 22: FPC-side GND terminal, 23: conductive wire, 24: pad, 25: ground connection wire, 25a: contact portion, 25b: connection portion, 26: ground wire, 27, 28: insulation layer, 32: touch controller (detection circuit), 41: ACF, 42: guard portion, L: break line

The invention claimed is:

1. A touch panel board comprising:
   an electrode board including;
      a support board,
      sensor electrodes supported on the support board,
      sensor connection terminals electrically connected to the sensor electrodes and supported on the support board and collectively arranged at an end of the sensor electrodes, and
      ground connection terminals supported on the support board and arranged at an outer side of the sensor connection terminals;
   a cover panel on the support board and including a projected end portion projected outward further than the support board and arranged on a projected side with respect to the sensor connection terminals, and an opposing surface opposite the electrode board, and the cover panel having a plate shape with the opposing surface facing the electrode board;
   a flexible wiring board including conductive wires one ends thereof being connected to the sensor connection terminals, respectively, and a ground wire within the flexible wiring board, the flexible wiring board extending from the support board toward the projected end portion;
   a conductive guard portion arranged on a side of the opposing surface of the projected end portion to be arranged on the projected side with respect to the sensor connection terminals; and
   a ground connection wire on the flexible wiring board electrically connecting the guard portion and the ground connection terminals, wherein
   the flexible wiring board includes an insulation layer covering the conductive wires and the ground wire,
   the ground connection wire includes a contact portion and a connection portion, the contact portion being defined on a surface of the insulation layer and in contact with the guard portion, and the connection portion being defined on the surface of the insulation layer and connecting the contact portion and the ground wire, and
   the guard portion is in contact with a portion of the insulation layer that includes the contact portion to fix the flexible wiring board.

2. The touch panel board according to claim 1, wherein the contact portion includes pads,
   the guard portion is made of an anisotropic conductive film, and
   the flexible wiring board is fixed with pressure to the projected end portion via the anisotropic conductive film.

3. The touch panel board according to claim 1, wherein the guard portion is made of a conductive adhesive layer.

4. The touch panel board according to claim 1, wherein the sensor connection terminals are arranged in a column, and
   the guard portion extends in a direction that the sensor connection terminals are arranged.

5. The touch panel board according to claim 1, further comprising a detection circuit that is electrically connected to the sensor electrodes via the flexible wiring board.

6. The touch panel board according to claim 1, wherein the support board includes a conductive block pattern arranged outside the sensor electrodes, and
   the ground wire has one end that is connected to the block pattern.

7. The touch panel board according to claim 1, wherein the electrode board has a main body portion and a test area portion,
   the sensor electrodes and the sensor connection terminals are formed in the main body portion and the test area portion is adjacent to the main body portion and separable from the main body portion, and
   the test area portion has a test pattern that is connected to the sensor connection terminals.

* * * * *